US011916323B2

(12) United States Patent
Maeda et al.

(10) Patent No.: US 11,916,323 B2
(45) Date of Patent: Feb. 27, 2024

(54) MULTIPOLAR CONNECTOR SET INCLUDING MULTIPLE CONNECTORS MOUNTED TO SUBSTRATES HAVING CONDUCTOR PATTERNS

(71) Applicant: Murata Manufacturing Co., Ltd., Kyoto-fu (JP)

(72) Inventors: Yoshiro Maeda, Nagaokakyo (JP); Aoi Tanaka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 232 days.

(21) Appl. No.: 17/355,832

(22) Filed: Jun. 23, 2021

(65) Prior Publication Data
US 2021/0320441 A1   Oct. 14, 2021

Related U.S. Application Data

(63) Continuation of application No. PCT/JP2019/049503, filed on Dec. 18, 2019.

(30) Foreign Application Priority Data

Dec. 27, 2018  (JP) .................... 2018-244488

(51) Int. Cl.
*H01R 12/71*  (2011.01)
*H01R 13/6461*  (2011.01)
(Continued)

(52) U.S. Cl.
CPC ....... *H01R 12/716* (2013.01); *H01R 13/6461* (2013.01); *H05K 1/0225* (2013.01); *H01R 13/03* (2013.01)

(58) Field of Classification Search
CPC .. H01R 12/716; H01R 13/6461; H01R 13/03; H01R 12/73; H05K 1/0225
See application file for complete search history.

(56) References Cited

U.S. PATENT DOCUMENTS 5,876,217 A * 3/1999 Ito ................ H01R 13/20
                                                      439/74
2004/0063344 A1* 4/2004 Shin .............. H01R 13/26
                                                      439/74
(Continued)

FOREIGN PATENT DOCUMENTS

CN        108390213 A     8/2018
JP        H01-165574 U   11/1989
(Continued)

OTHER PUBLICATIONS

International Search Report issued in PCT/JP2019/049503; dated Feb. 10, 2020.
(Continued)

*Primary Examiner* — Abdullah A Riyami
*Assistant Examiner* — Nelson R. Burgos-Guntin
(74) *Attorney, Agent, or Firm* — Studebaker & Brackett PC

(57) ABSTRACT

A multipolar connector set includes a first connector, a second connector including structure capable of being fitted to the first connector, a first substrate on which the first connector is mounted, a second substrate on which the second connector is mounted, a first ground conductor pattern formed on the first substrate, and a second ground conductor pattern formed on the second substrate. The first connector includes a first insulating member, first internal terminals held by the first insulating member and arranged in a first direction, and a first external terminal held by the first insulating member and connected to ground potential. The second substrate has a second conductor pattern non-formation region in which the second ground conductor pattern is not present at a position facing the first external terminal, when the first connector and the second connector are fitted to each other.

12 Claims, 5 Drawing Sheets

(51) Int. Cl.
*H05K 1/02* (2006.01)
*H01R 13/03* (2006.01)

(56) References Cited

U.S. PATENT DOCUMENTS

| | | | | |
|---|---|---|---|---|
| 2006/0024991 | A1* | 2/2006 | Kuo | H01R 13/6595 |
| | | | | 439/74 |
| 2008/0261462 | A1* | 10/2008 | Mizumura | H01R 12/00 |
| | | | | 439/876 |
| 2011/0014800 | A1* | 1/2011 | Cheng | H01R 12/716 |
| | | | | 439/55 |
| 2012/0231637 | A1* | 9/2012 | Takeuchi | H01R 12/716 |
| | | | | 439/65 |
| 2013/0102184 | A1* | 4/2013 | Suzuki | H01H 27/00 |
| | | | | 439/374 |
| 2015/0140840 | A1* | 5/2015 | Nishimura | H01R 12/775 |
| | | | | 439/74 |
| 2015/0180148 | A1* | 6/2015 | Hashiguchi | H01R 12/716 |
| | | | | 439/74 |
| 2015/0194753 | A1* | 7/2015 | Raff | H01R 12/716 |
| | | | | 29/830 |
| 2018/0115099 | A1* | 4/2018 | Endo | H01R 13/113 |
| 2018/0301829 | A1* | 10/2018 | Hoyack | H01R 12/73 |
| 2019/0280409 | A1* | 9/2019 | Hoshiba | H01R 13/646 |
| 2021/0167555 | A1* | 6/2021 | Oosaka | H01R 13/6581 |
| 2021/0328385 | A1* | 10/2021 | Maeda | H05K 1/18 |
| 2021/0359469 | A1* | 11/2021 | Oosaka | H01R 12/73 |
| 2021/0359473 | A1* | 11/2021 | Oosaka | H01R 12/716 |
| 2021/0391669 | A1* | 12/2021 | Okubo | H01R 13/6582 |
| 2022/0045445 | A1* | 2/2022 | Oosaka | H05K 3/303 |
| 2022/0209444 | A1* | 6/2022 | Kobayashi | H01R 12/73 |
| 2022/0360023 | A1* | 11/2022 | Kim | H01R 12/73 |
| 2022/0393376 | A1* | 12/2022 | Oosaka | H01R 13/2442 |

FOREIGN PATENT DOCUMENTS

| | | |
|---|---|---|
| JP | 2016-012567 A | 1/2016 |
| JP | 2018-116928 A | 7/2018 |

OTHER PUBLICATIONS

Written Opinion of the International Searching Authority issued in PCT/JP2019/049503; dated Feb. 10, 2020.

\* cited by examiner

FIRST DIRECTION

MULTIPOLAR CONNECTOR SET INCLUDING MULTIPLE CONNECTORS MOUNTED TO SUBSTRATES HAVING CONDUCTOR PATTERNS

CROSS-REFERENCE TO RELATED APPLICATIONS

This application claims benefit of priority to International Patent Application No. PCT/JP2019/049503, filed Dec. 18, 2019, and to Japanese Patent Application No. 2018-244488, filed Dec. 27, 2018, the entire contents of each are incorporated herein by reference.

BACKGROUND

Technical Field

The present disclosure relates to a multipolar connector set configured by fitting multiple connectors to each other.

Background Art

In the past, a multipolar connector set configured by fitting multiple connectors to each other has been devised. For example, a multipolar connector set described in Japanese Unexamined Patent Application No. 2018-116928 is configured by fitting a terminal of a first connector and a terminal of a second connector to each other.

SUMMARY

However, when the multipolar connector set as described in Japanese Unexamined Patent Application No. 2018-116928 is mounted on a substrate, capacitive coupling occurs between the first connector and the second connector, and a ground of the substrate. Accordingly, for example, there is a possibility that characteristic deterioration occurs in a high-frequency band of 30 GHz or higher.

Accordingly, the present disclosure provides a multipolar connector set in which characteristic deterioration in a high-frequency band is suppressed.

An aspect of a multipolar connector set according to the present disclosure includes a first connector, a second connector including structure capable of being fitted to the first connector, a first substrate on which the first connector is mounted, a second substrate on which the second connector is mounted, a first ground conductor pattern formed on the first substrate, and a second ground conductor pattern formed on the second substrate. The first connector includes a first insulating member, a plurality of first internal terminals held by the first insulating member and arranged in a first direction, and a first external terminal held by the first insulating member and connected to ground potential. The second substrate has a second conductor pattern non-formation region in which the second ground conductor pattern is not present at a position facing the first external terminal, when the first connector and the second connector are fitted to each other.

In this configuration, no ground conductor is formed at a position of the second substrate facing the first external terminal. That is, since capacitive coupling does not occur between the first external terminal and the second ground conductor pattern (ground), it is possible to suppress characteristic deterioration.

An aspect of the multipolar connector set according to the present disclosure includes a first connector, a second connector fitted to the first connector, a substrate on which the second connector is arranged, and a ground conductor pattern formed on the substrate. The first connector includes a first insulating member, a plurality of first internal terminals held by the first insulating member and arranged in a first direction, and a first external terminal held by the first insulating member and connected to ground potential. The substrate has a conductor pattern non-formation region in which no ground conductor pattern is present at a position facing the first external terminal, when the first connector and the second connector are fitted to each other.

In this configuration, no ground is formed at a position of the substrate facing the first external terminal. That is, since capacitive coupling does not occur between the first external terminal and the ground conductor pattern (ground), it is possible to suppress characteristic deterioration. For example, such structure may be adopted in which the first connector is directly connected to a transmission line.

According to the present disclosure, it is possible to provide a multipolar connector set in which characteristic deterioration in a high-frequency band is suppressed.

DETAILED DESCRIPTION

First Embodiment

Figure 1A:
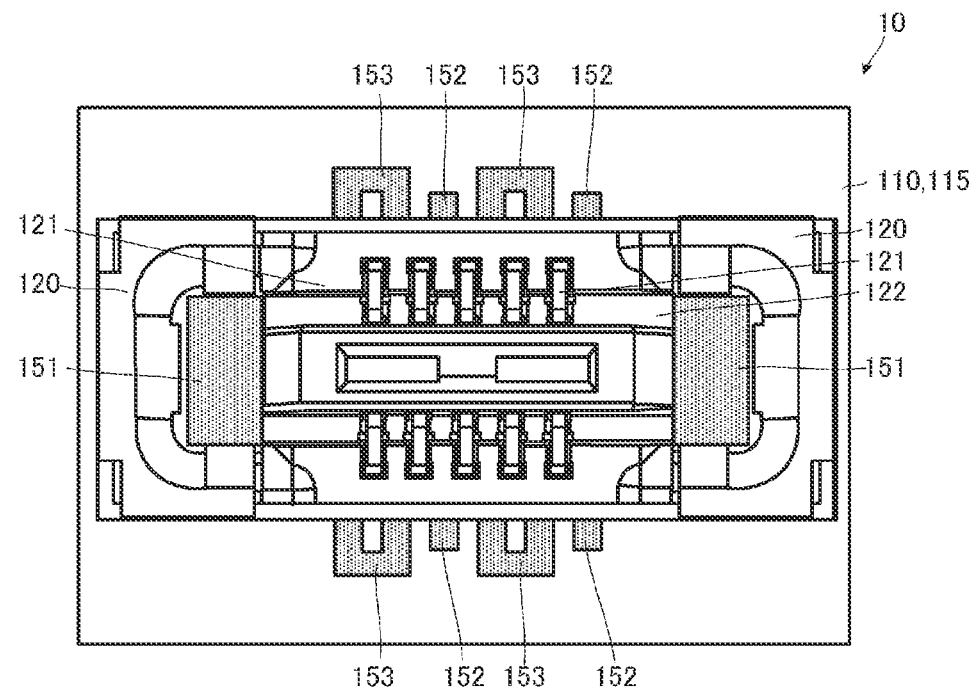
FIG. 1A is a plan view of a first connector according to a first embodiment.
Figure 1B:
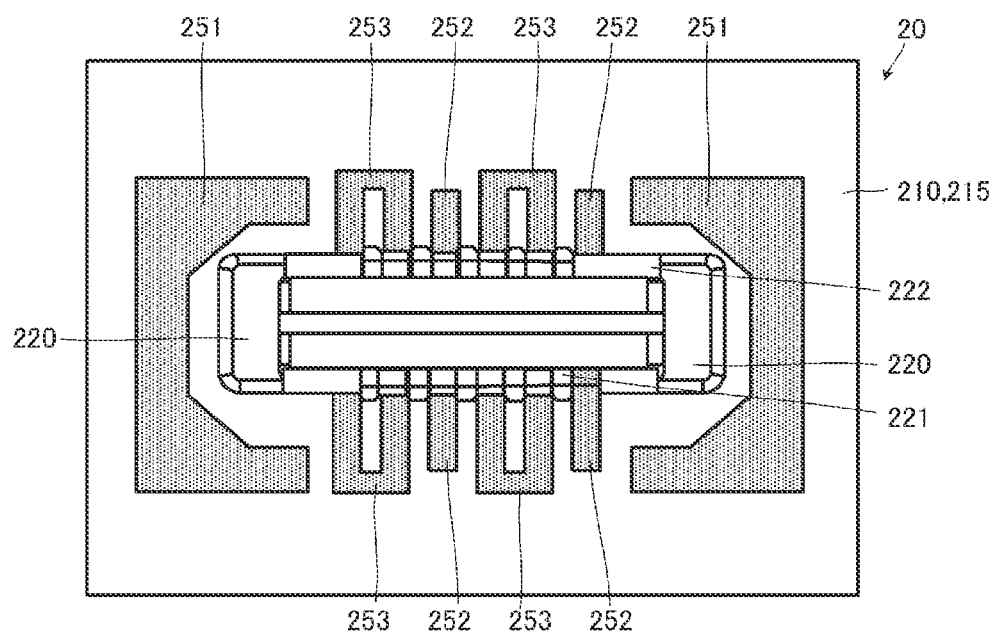
FIG. 1B is a plan view of a second connector according to the first embodiment.
Figure 2A:
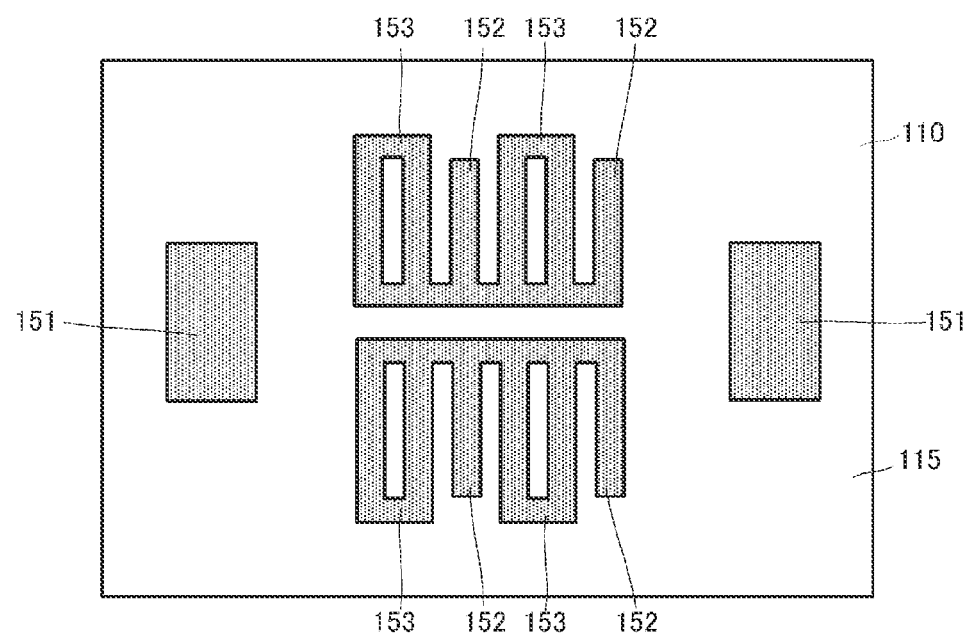
FIG. 2A is a plan view of a first ground conductor pattern according to the first embodiment.
Figure 2B:
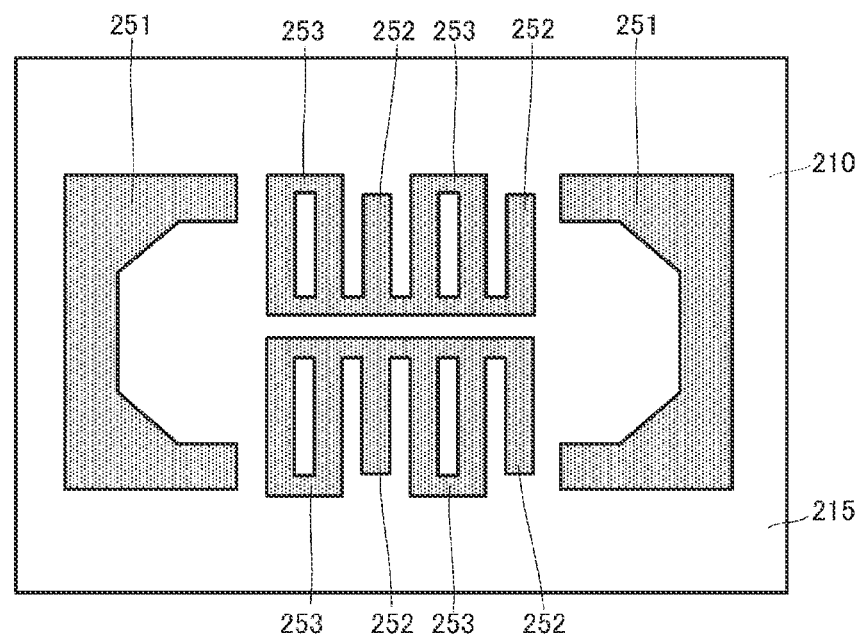
FIG. 2B is a plan view of a second ground conductor pattern according to the first embodiment.
Figure 3:
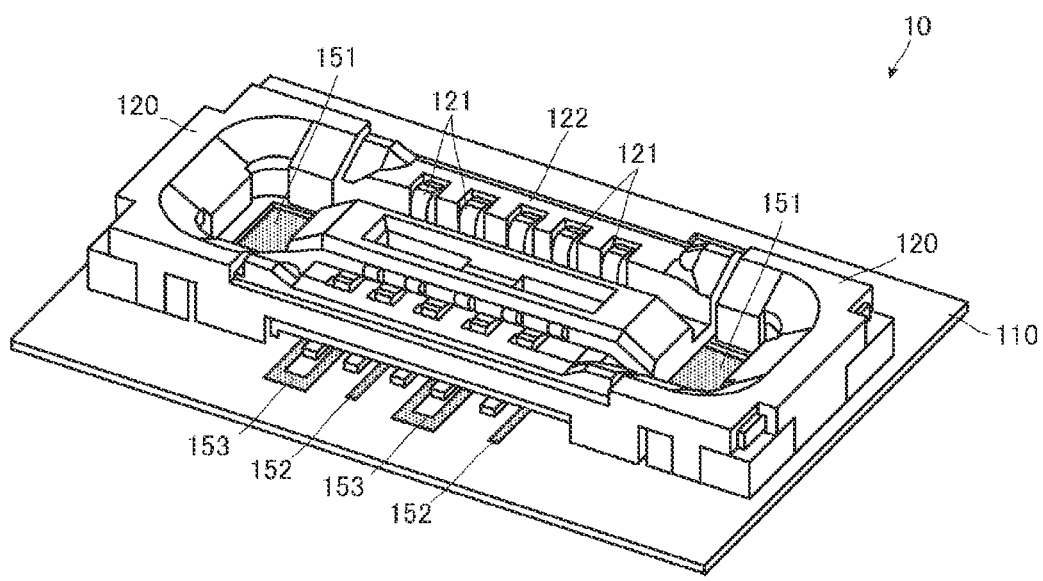
FIG. 3 is an external perspective view of the first connector according to the first embodiment.
Figure 4:
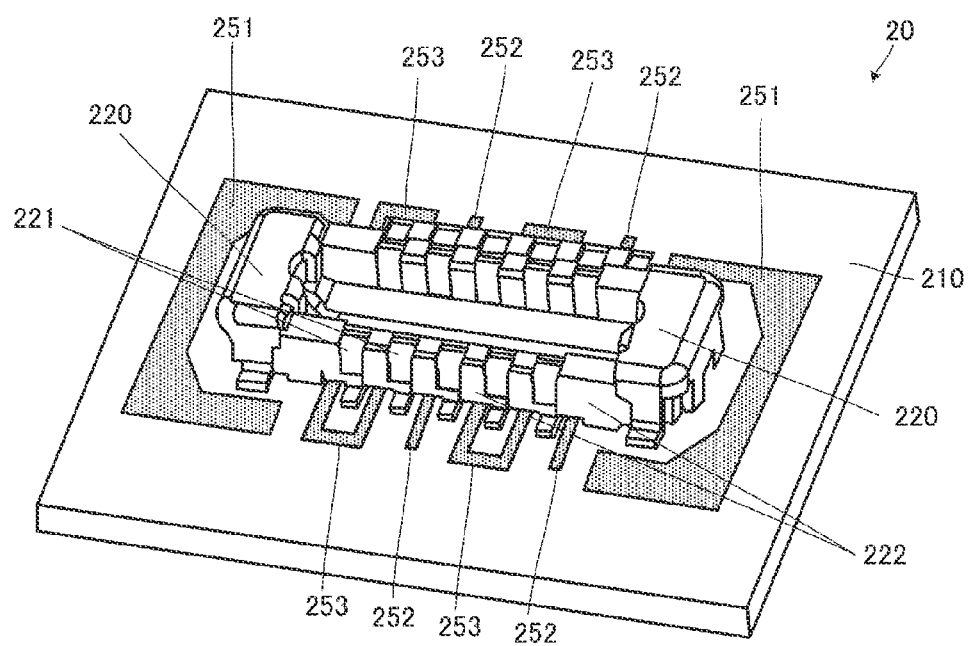
FIG. 4 is an external perspective view of the second connector according to the first embodiment.
Figure 5A:
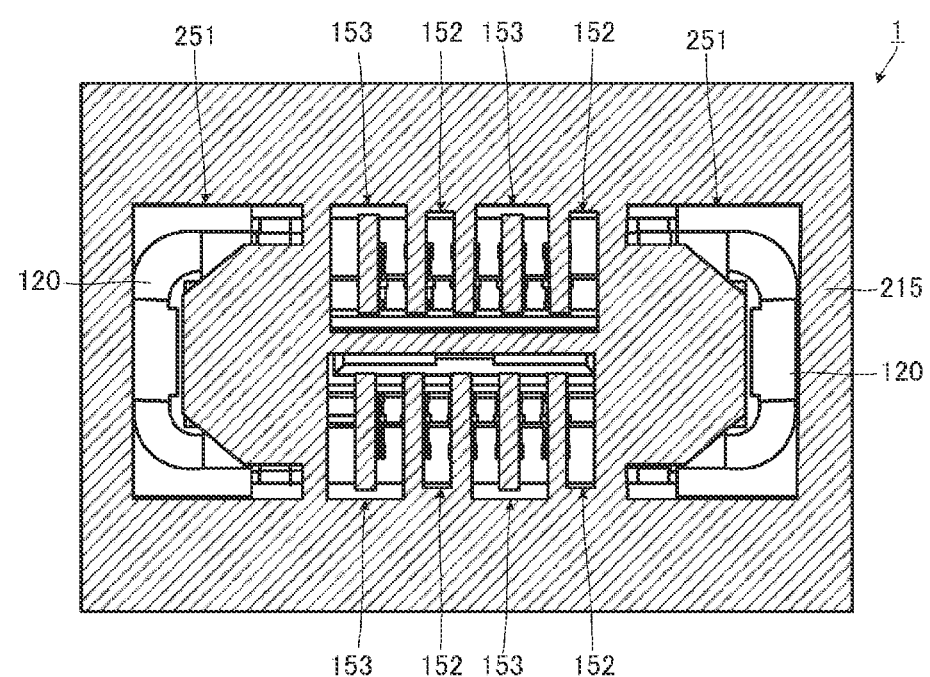
FIG. 5A and FIG. 5B are plan views of a multipolar connector set according to the first embodiment.
Figure 5B:
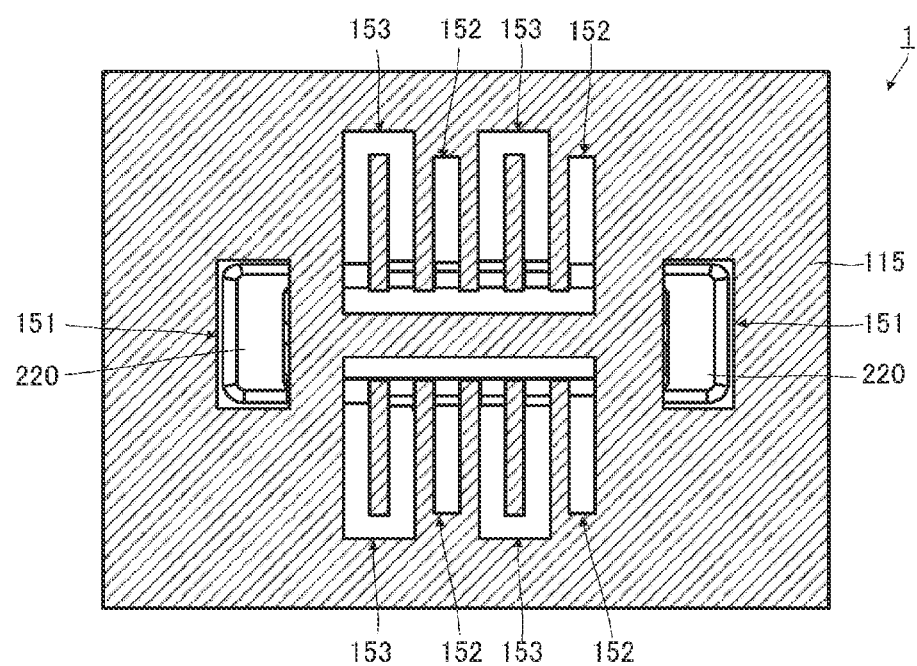
Figure 6A:
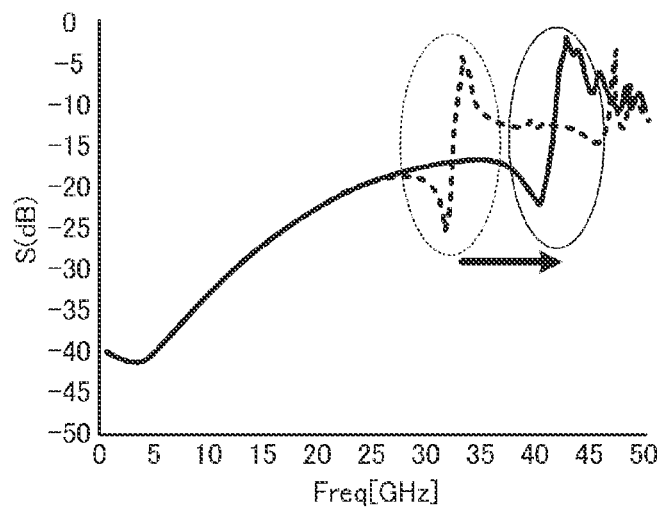
FIG. 6A to FIG. 6C are graphs showing characteristics of the multipolar connector set according to the first embodiment.
Figure 6B:
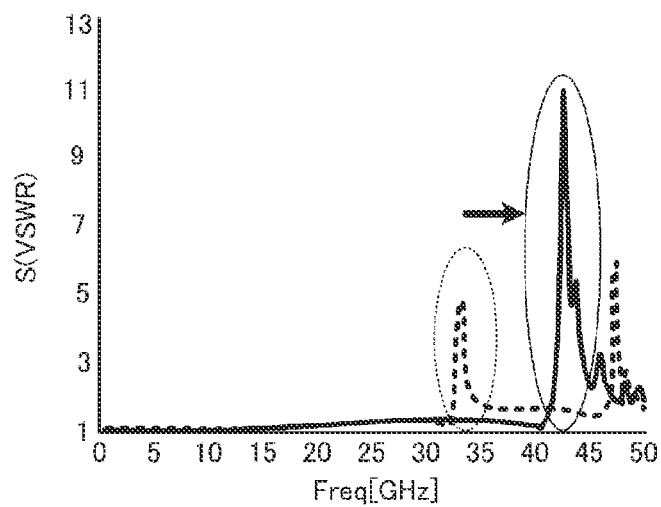
Figure 6C:
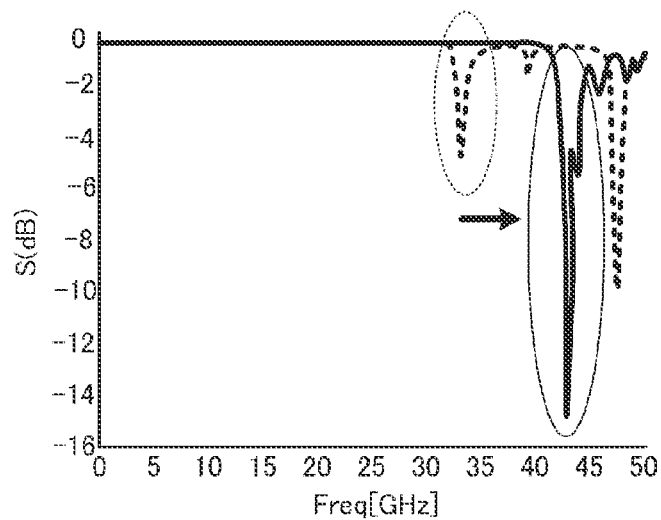

A multipolar connector set according to a first embodiment of the present disclosure will be described with reference to the accompanying drawings. FIG. 1A is a plan view of the first connector 10 according to the first embodiment, and FIG. 1B is a plan view of the second connector 20 according to the first embodiment. FIG. 2A is a plan view of the first ground conductor pattern 115 according to the first embodiment, and FIG. 2B is a plan view of the second ground conductor pattern 215 according to the first embodiment. FIG. 3 is an external perspective view of the first connector 10 according to the first embodiment. FIG. 4 is an external perspective view of the second connector 20 according to the first embodiment. FIG. 5A and FIG. 5B are plan views of the multipolar connector set 1 according to the first embodiment. FIG. 6A to FIG. 6C are graphs showing characteristics of the multipolar connector set 1 according to the first embodiment. Note that, in each of the drawings in the following embodiments, a longitudinal and lateral dimensional relationship is appropriately emphasized and described, and does not necessarily coincide with a longitudinal and lateral dimensional relationship in actual dimensions. In order to make the figure easy to see, some reference numerals are omitted.

As illustrated in FIG. 1A, FIG. 1B, FIG. 2A, FIG. 2B, FIG. 3, and FIG. 4, the multipolar connector set 1 includes the first connector 10, the second connector 20, a first substrate 110, and a second substrate 210. The multipolar connector set 1 is configured by fitting the first connector 10 and the second connector 20 to each other. Note that, in FIG. 1A, FIG. 1B, FIG. 2A, FIG. 2B, FIG. 3, and FIG. 4, a region where no ground conductor pattern is formed is hatched for making the figure comprehensible.

First, a configuration of the first connector 10 will be described with reference to FIG. 1A, FIG. 2A, and FIG. 3.

The first connector 10 includes a first external terminal 120, a plurality of first internal terminals 121, and a first insulating member 122. A direction along a longitudinal direction in plan view of the first connector 10 is defined as a first direction. The first insulating member 122 is substantially rectangular in plan view. The term "in plan view" refers to a view in a direction in which a connector on the other side is fitted.

The first insulating member 122 has a plurality of grooves, and the first internal terminals 121 are fitted to and held by the grooves. More specifically, the first internal terminals 121 are regularly arranged along the first direction. In other words, the first internal terminals 121 are arranged in line with the grooves formed in the first insulating member 122. Each of the first internal terminals 121 is a conductor connected to signal potential or the ground potential.

The first external terminal 120 and the first internal terminals 121 are each formed using, for example, phosphor bronze. This enables elastic deformation to be achieved while predetermined hardness is maintained. The first insulating member 122 is a member having an insulating property, and is formed using, for example, resin.

The first external terminal 120 is formed at each end in the first direction in plan view of the first insulating member 122. The first external terminal 120 is in a shape having a concave portion. The concave portion is formed by an outer wall included in the first external terminal 120. More specifically, shapes of the respective outer walls are shapes obtained by rotating substantially U-shaped portions by ±90° respectively in plan view. The first external terminals 120 are formed such that portions having the U-shaped openings face each other.

Next, structure of the first substrate 110 will be described. The first substrate 110 has the first ground conductor pattern 115. The first connector 10 is mounted on one main surface of the first substrate 110.

The first ground conductor pattern 115 includes a first slit 151, a second slit 152, and a third slit 153.

The first slit 151 is a region in a rectangular shape where the first ground conductor pattern 115 is not formed. The second slit 152 is a region in a comb-tooth shape where the first ground conductor pattern 115 is not formed. The third slit 153 is a region in a substantially rectangular ring shape where the first ground conductor pattern 115 is not formed. The first ground conductor pattern 115 is connected to a ground conductor pattern or the like in another layer of the first substrate 110 by a via or the like (not illustrated).

A more specific shape of the first ground conductor pattern 115 will be described.

The first slit 151 is firmed in a concave portion formed by the first external terminal 120 described above. That is, the first slit 151 has a shape surrounded by the outer wall forming the first external terminal 120. In other words, the first ground conductor pattern 115 is not formed (not present) in the concave portion formed by the first external terminal 120. Note that, the first slit 151 corresponds to a "first conductor pattern non-formation region" of the present disclosure.

The second slit 152 is formed between the above-described first internal terminals 121 adjacent to each other in plan view of the first connector 10. In other words, the first ground conductor pattern 115 is not formed between the adjacent first internal terminals 121.

The third slit 153 is formed so as to surround a specific one of the first internal terminals 121 in plan view of the first connector 10, and the specific one of the first internal terminals 121 is connected to a conductor pattern (not illustrated) formed in an inner layer of the first substrate 110.

Next, a configuration of the second connector 20 will be described with reference to FIG. 1B, FIG. 2B, and FIG. 4.

The second connector 20 includes a plurality of second external terminals 220, a plurality of second internal terminals 221, and a second insulating member 222. The second insulating member 222 is substantially rectangular in plan view.

The second insulating member 222 is formed by insert-molding the second internal terminal 221. More specifically, the second internal terminals 221 are regularly arranged along the first direction. Further, each of the second internal terminals 221 is a conductor connected to the signal potential or the ground potential.

The second external terminals 220 and the second internal terminals 221 are each formed using, for example, phosphor bronze. This enables elastic deformation to be achieved while predetermined hardness is maintained. Further, the second insulating member 222 is a member having an insulating property, and is formed using, for example, resin.

The second external terminal 220 is formed at each end in the first direction in plan view of the second insulating member 222. The second external terminal 220 is in a shape having a convex portion. The convex portion has a substantially rectangular parallelepiped shape.

Next, structure of the second substrate 210 will be described. The second substrate 210 has the second ground conductor pattern 215. The second connector 20 is mounted on one main surface of the second substrate 210.

The second ground conductor pattern 215 includes a fourth slit 251, a fifth slit 252, and a sixth slit 253.

The fourth slits 251 have respective shapes obtained by rotating substantially U-shaped portions by ±90° in plan view, and are each a region in which a second ground conductor is not formed (not present such that portions having the respective U-shaped openings face each other. The fifth slit 252 is a region in a comb-tooth shape where the second ground conductor pattern 215 is not formed. The sixth slit 253 is a region in a substantially rectangular ring shape where the second ground conductor pattern 215 is not formed. The second ground conductor pattern 215 is connected to a ground conductor pattern or the like in another layer of the second substrate 210 by a via or the like (not illustrated). Note that, the fourth slit 251 corresponds to the "second conductor pattern non-formation region" of the present disclosure.

A more specific shape of the second ground conductor pattern 215 will be described. The fourth slit 251 is formed so as to surround the second external terminal 220 described above. In other words, the fourth slit 251 is formed so as to surround the second external terminal 220 and the second ground conductor pattern 215 is not formed in the fourth slit 251.

The fifth slit 252 is formed between the above-described second internal terminals 221 adjacent to each other in plan view. In other words, the second ground conductor pattern 215 is not formed between the adjacent second internal terminals 221.

The sixth slit 253 is formed so as to surround a specific one of the second internal terminals 221, and an extending conductor for connecting the specific one of the second internal terminals 221 to an external terminal (not illustrated) is formed.

A configuration of the multipolar connector set 1 will be described using the first connector 10, the second connector 20, the first substrate 110, and the second substrate 210 described above. The multipolar connector set 1 is arranged such that the first connector 10 and the second connector 20 are fitted to each other. The second external terminal 220 of the second connector 20 is arranged so as to be fitted to the first external terminal 120 (the outer wall of the first external terminal 120) of the first connector 10. Further, the first internal terminal 121 of the first connector 10 is arranged so as to be in contact with the second internal terminal 221 of the second connector 20. Accordingly, the first connector 10 and the second connector 20 are fitted to each other.

As described above, the first external terminal 120 and the second external terminal 220 are each made of metal such as phosphor bronze. This facilitates guiding when the first external terminal 120 and the second external terminal 220 are fitted to each other. Further, the first external terminal 120 and the second external terminal 220 are capable of protecting the first insulating member 122 and the second insulating member 222 from damage due to external stress or the like. Further, an effect of shielding against unnecessary radiation from the first internal terminal 121 and the second internal terminal 221 to an outside is exerted. In addition, it is possible to suppress propagation of a noise from the outside to the first internal terminal 121 and the second internal terminal 221.

A more specific state in which the first connector 10 and the second connector 20 are fitted to each other will be described with reference to FIG. 5A and FIG. 5B. In FIG. 5A, the second substrate 210 is omitted, and in FIG. 5B, the first substrate 110 is omitted.

FIG. 5A is a diagram of the multipolar connector set 1 viewed from a side of the second connector 20 (second substrate 210). By fitting the first connector 10 and the second connector 20 to each other, the first external terminal 120 overlaps the fourth slit 251 in plan view. At this time, the second ground conductor pattern 215 is not formed at a position facing the first external terminal 120.

FIG. 5B is a diagram of the multipolar connector set 1 viewed from a side of the first connector 10 (first substrate 110). By fitting the first connector 10 and the second. connector 20 to each other, the second external terminal 220 overlaps the first slit 151 in plan view. At this time, the first ground conductor pattern 115 is not formed at a position facing the second external terminal 220.

As described above, the first external terminal 120, the first internal terminal 121, the second external terminal 220, and the second internal terminal 221 are each formed using phosphor bronze. That is, when these terminals come close to the first ground conductor pattern 115 and the second ground conductor pattern 215, capacitive coupling occurs.

However, since the fourth slit 251 is provided at a position facing the first external terminal 120, it is possible to reduce the occurrence of capacitive coupling.

Similarly, since the first slit 151 is provided at a position facing the second external terminal 220, it is possible to reduce the occurrence of capacitive coupling.

As can be seen from the above configuration, a shape of the first slit 151 is preferably substantially the same as a shape of the second external terminal 220 in plan view. Similarly, a shape of the fourth slit 251 is preferably substantially the same as a shape of the first external terminal 120 in plan view.

With reference to FIG. 6A to FIG. 6C, electrical characteristics of the multipolar connector set 1 to which the above-described configuration is applied, and a connector set according to the related art will be described using graphs. In the multipolar connector set according to the related art, the first slit 151 and the fourth slit 251 are not formed.

FIG. 6A is a graph showing return loss (reflection characteristics) of the multipolar connector set according to the related art and the multipolar connector set 1 of the present disclosure. The multipolar connector set according to the related art is indicated by a broken line, and the multipolar connector set 1 of the present disclosure is indicated by a solid line.

As shown in FIG. 6A, in the multipolar connector set according to the related art, the return loss rapidly deteriorates at frequencies near about 33 GHz. On the other hand, in the multipolar connector set 1 of the present disclosure, the return loss does not rapidly deteriorate until frequencies near about 43 GHz. That is, the deterioration of characteristics of the multipolar connector set 1 of the present disclosure does not occur until frequencies near about 43 GHz. Thus, the multipolar connector set 1 is available at a higher frequency compared to the multipolar connector set according to the related art.

FIG. 6B is a graph showing VSWR (Voltage Standing Wave Ratio) (reflection characteristics) of each of the multipolar connector set according to the related art and the multipolar connector set 1 of the present disclosure. The multipolar connector set according to the related art is indicated by a broken line, and the multipolar connector set 1 of the present disclosure is indicated by a solid line.

As shown in FIG. 6B, similar to FIG. 6A, in the multipolar connector set according to the related art, the VSWR (Voltage Standing Wave Ratio) rapidly deteriorates at frequencies near about 33 GHz. On the other hand, in the multipolar connector set 1 of the present disclosure, the VSWR (Voltage Standing Wave Ratio) does not deteriorate until frequencies near about 43 GHz. That is, the deterioration of characteristics of the multipolar connector set 1 of the present disclosure does not occur until frequencies near about 43 GHz. Thus, the multipolar connector set 1 is available at a higher frequency compared to the multipolar connector set according to the related art.

FIG. 6C is a graph showing insertion loss (pass characteristic) of each of the multipolar connector set according to the related art and the multipolar connector set 1 of the present disclosure. The multipolar connector set according to the related art is indicated by a broken line, and the multipolar connector set 1 of the present disclosure is indicated by a solid line.

As shown in FIG. 6C, similar to FIG. 6A and FIG. 6B, in the multipolar connector set according to the related art, the insertion loss rapidly deteriorates at frequencies near about 33 GHz. On the other hand, in the multipolar connector set 1 of the present disclosure, the insertion loss does not deteriorate until frequencies near about 43 GHz. That is, the deterioration of characteristics of the multipolar connector set 1 of the present disclosure does not occur until frequencies near about 43 GHz. Thus, the multipolar connector set 1 is available at a higher frequency compared to the multipolar connector set according to the related art.

By using the above-described multipolar connector set 1, it is possible to suppress capacitive coupling occurring between the connector and the terminal, and the ground. Thus, it is possible to suppress characteristic deterioration in a high-frequency band of frequencies equal to or higher than 30 GHz, and to shift the characteristic deterioration to the outside of a desired frequency band.

Note that, in the above-described configuration, the example has been described in which the region in which a conductor is not formed is formed in each of the first ground conductor pattern (first substrate) and the second ground conductor pattern (second substrate). However, it is possible to obtain the effect by forming the region in which a conductor is not formed in one of the first ground conductor pattern (first substrate) and the second ground conductor pattern (second substrate) as well. However, regions where no conductor is formed may be formed in both the first ground conductor pattern (first substrate) and the second ground conductor pattern (second substrate) respectively. Not only rigid substrates but also flexible substrates or other members, with which a base on which a connector is mountable is configurable, may be used for the first substrate and the second substrate.

What is claimed is:

1. A multipolar connector set, comprising:
    a first connector including a first insulating member, a plurality of first internal terminals held by the first insulating member and arranged in a first direction, and a first external terminal held by the first insulating member and connected to ground potential;
    a second connector including structure configured to fit to the first connector;
    a first substrate on which the first connector is mounted;
    a second substrate on which the second connector is mounted;
    a first ground conductor pattern on the first substrate; and
    a second ground conductor pattern on the second substrate, wherein
    the second substrate has a second conductor pattern non-formation region in which the second ground conductor pattern is absent at a position facing the first external terminal, when the first connector and the second connector are fitted to each other.

2. The multipolar connector set according to claim 1, wherein
    the second connector includes a second external terminal,
    the first external terminal has a convex portion,
    the second external terminal has a concave portion,
    the convex portion is fitted to the concave portion, and
    the second conductor pattern non-formation region overlaps the convex portion.

3. The multipolar connector set according to claim 1, wherein
    the second connector includes a second external terminal,
    the first external terminal has a concave portion defined by an outer wall,
    the second external terminal has a convex portion,
    the convex portion is fitted to the concave portion, and
    the second conductor pattern non-formation region overlaps the outer wall, when the convex portion and the concave portion are fitted to each other.

4. The multipolar connector set according to claim 2, wherein
    the second connector includes
    a second insulating member,
    a plurality of second internal terminals held by the second insulating member, and
    a second external terminal held by the second insulating member and connected to ground potential, and
    the first substrate has a first conductor pattern non-formation region in which the first ground conductor pattern is absent at a position facing the second external terminal, when the first connector and the second connector are fitted to each other.

5. The multipolar connector set according to claim 4, wherein
    the first conductor pattern non-formation region is configured so as to surround at least one of the first internal terminals in plan view.

6. The multipolar connector set according to claim 3, wherein
    the second connector includes
    a second insulating member,
    a plurality of second internal terminals held by the second insulating member, and
    a second external terminal held by the second insulating member and connected to ground potential, and
    the first substrate has a first conductor pattern non-formation region in which the first ground conductor pattern is absent at a position facing the second external terminal, when the first connector and the second connector are fitted to each other.

7. The multipolar connector set according to claim 6, wherein
    the first conductor pattern non-formation region is configured so as to surround at least one of the first internal terminals in plan view.

8. A multipolar connector set, comprising:
    a first connector including a first insulating member a plurality of first internal terminals held by the first insulating member and arranged in a first direction, and a first external terminal held by the first insulating member and connected to ground potential;
    a second connector fitted to the first connector;
    a substrate on which the second connector is arranged; and
    a ground conductor pattern on the substrate, wherein
    the substrate includes
    a conductor pattern non-formation region in which the ground conductor pattern is absent at a position facing the first external terminal, when the first connector and the second connector are fitted to each other.

9. The multipolar connector set according to claim 8, wherein
    the second connector includes a second external terminal,
    the first external terminal has a convex portion,
    the second external terminal has a concave portion,
    the convex portion is fitted to the concave portion, and
    the second conductor pattern non-formation region overlaps the convex portion.

10. The multipolar connector set according to claim 8, wherein
    the second connector includes a second external terminal,
    the first external terminal has a concave portion defined by an outer wall, the second external terminal has a convex portion, the convex portion is fitted to the concave portion, and the second conductor pattern non-formation region overlaps the outer wall, when the convex portion and the concave portion are fitted to each other.

11. The multipolar connector set according to claim 9, wherein the second connector includes a second insulating member, a plurality of second internal terminals held by the second insulating member, and a second external terminal held by the second insulating member and connected to ground potential.

12. The multipolar connector set according to claim 10, wherein the second connector includes a second insulating member, a plurality of second internal terminals held by the second insulating member, and a second external terminal held by the second insulating member and connected to ground potential.

* * * * *